(12) United States Patent
Jarvis

(10) Patent No.: US 6,258,437 B1
(45) Date of Patent: Jul. 10, 2001

(54) TEST STRUCTURE AND METHODOLOGY FOR CHARACTERIZING ETCHING IN AN INTEGRATED CIRCUIT FABRICATION PROCESS

(75) Inventor: Richard W. Jarvis, Austin, TX (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/282,329

(22) Filed: Mar. 31, 1999

(51) Int. Cl.[7] .................................................. B32B 3/24
(52) U.S. Cl. .................... 428/137; 428/131; 428/195; 428/203; 428/201; 428/156; 428/901; 257/432; 257/431; 257/435; 257/436; 438/16; 324/501; 324/751; 324/752; 324/765; 324/766; 324/767; 324/768; 324/769
(58) Field of Search .................................... 428/131, 137, 428/195, 203, 201, 156; 257/432, 431, 435, 436; 438/16; 324/501, 751, 752, 765, 766, 767, 768, 769

(56) References Cited

U.S. PATENT DOCUMENTS

| | | | |
|---|---|---|---|
| 3,751,647 | 8/1973 | Maeder et al. | 235/151.11 |
| 3,842,491 | 10/1974 | Depuy et al. | 29/580 |
| 3,983,479 | 9/1976 | Lee et al. | 324/158 R |
| 4,838,987 | * 6/1989 | Dobson | 156/626 |
| 4,855,253 | 8/1989 | Weber | 437/8 |
| 5,159,752 | 11/1992 | Mahant-Shetti et al. | 29/846 |
| 5,395,769 | * 3/1995 | Arienzo et al. | 437/7 |
| 5,514,974 | 5/1996 | Bouldin | 324/756 |
| 5,576,223 | 11/1996 | Zeininger et al. | 437/8 |
| 5,578,161 | * 11/1996 | Auda | 156/626.1 |
| 5,639,342 | * 6/1997 | Chen et al. | 156/626.1 |
| 5,670,891 | 9/1997 | Ling et al. | 324/765 |
| 5,739,051 | * 4/1998 | Saito | 438/16 |
| 5,773,315 | 6/1998 | Jarvis | 438/14 |
| 5,959,459 | 9/1999 | Satya et al. | 324/751 |
| 6,046,061 | * 4/2000 | Tsao et al. | 438/16 |
| 6,060,328 | * 5/2000 | En et al. | 438/9 |
| 6,121,064 | * 9/2000 | Lasky et al. | 438/16 |

OTHER PUBLICATIONS

Hess et al., "Modeling of Real Defect Outlines for Defect Size Distribution and Yield Prediction," Proc. IEEE 1993 Int. Conference on Microelectronic Test Structures, vol. 6, Mar. 1993.

Hess et al., "Drop In Process Control Checkerboard Test Structure for Efficient Online–Process Characterization and Defect Problem Debugging," Proc. IEEE 1994 Int. Conference on Microelectronic Test Structures, vol. 7, Mar. 1994.

Hess et al., "Modeling of Test Structures for Efficient Online Defect Monitoring Using a Digital Tester," Proc. IEEE 1994 Int. Conference on Microelectronic Test Structures, vol. 7, Mar. 1994.

(List continued on next page.)

Primary Examiner—William P. Watkins
(74) Attorney, Agent, or Firm—Kevin L. Daffer; Conley, Rose & Tayon P.C.

(57) ABSTRACT

A test structure for characterizing etching procedures used in integrated circuit fabrication processes and a method for using the test structure are described. The test structure includes a contrast layer, a simulated substrate, and a pattern layer arranged in order upon a substrate. The simulated substrate includes portions mimicking a semiconductor substrate and portions mimicking isolation regions. Etching of the pattern layer may be performed according to a procedure used in the fabrication of integrated circuits. The contrast layer may be selectively etched relative to the substrate, the simulated substrate, and the pattern layer. Exposure of the etched test structure to a wet etchant selective for the contrast layer may be used to identify defects resulting from over-etching or other errors in the integrated circuit fabrication procedure being tested.

14 Claims, 5 Drawing Sheets

OTHER PUBLICATIONS

Hess, "Strategy to Optimize the Development, Use, and Dimension of Test Structures to Control Defect Appearance in Backend Process Steps," Proc. IEEE/SEMI 1994 Advanced Semiconductor Manufacturing Conference, vol. 5, Nov. 1994.

Hess et al., "Defect Parameter Extraction in Backend Process Steps Using a Multilayer Checkerboard Test Structure," Proc. IEEE 1995 Int. Conference on Microelectronic Test Structures, vol. 8, Mar. 1995.

Hess et al., "Influence of Short Circuits on Data of Contact & Via Open Circuits Determined by a Novel Weave Test Structure," Proc. IEEE 1995 Int. Conference on Microelectronic Test Structures, vol. 8, Mar. 1995.

Hess et al., "Resistance Modeling of Test Structures for Accurate Fault Detection in Backend Process Steps Using a Digital Tester," Proc. IEEE 1995 Int. Conference on Microelectronic Test Structures, vol. 8, Mar. 1995.

Hess et al., "A Digital Tester Based Measurement Methodology for Process Conrol in Multilevel Metallization Systems," Proc. SPIE's 1995 Microelectronic Manufacturing Conference, vol. 2637, Oct. 1995.

Hess et al., "Control of Application Specific Interconnection on Gate Arrays Using an Active Checkerboard Test Structure," Proc. IEEE 1996 Int. Conference on Microelectronic Test Structures, vol. 9, Mar. 1996.

Hess et al., "Correlation Between Particle Defects and Electrical Faults Determined with Laser Scattering Systems and Digital Measurements on Checkerboard Test Structures," Proc. SPIE's 1996 Microelectronic Manufacturing Conference, vol. 2874, Oct. 1996.

Hess et al., "Issues on the Size and Outline of Killer Defects and their Influence on Yield Modeling" Proc. IEEE/SEMI 1996 Advanced Semiconductor Manufacturing Conference, vol. 7, Nov. 1996.

Hess et al., "Determination of Defect Size Distributions Based on Electrical Measurements at a Novel Harp Test Structure," Proc. IEEE 1997 Int. Conference on Microelectronic Test Structures, vol. 10, Mar. 1997.

Hess et al., "Issues on Short Circuits in Large On–Chip Power MOS–Transistors Using a Modified Checkerboard Test Structure," Proc. IEEE 1997 Int. Conference on Microelectronic Test Structures, vol. 10, Mar. 1997.

Hess et al., "Customized Checkerboard Test Structures to Localize Interconnection Point Defects," Proc. 1997 VLSI Multilevel Interconnection Conference, vol. 14, Jun. 1997.

Hess et al., "Comparison of Defect Size Distributions Based on Electrical and Optical Measurement Procedures," Proc. IEEE/SEMI 1997 Advanced Semiconductor Manufacturing Conference, vol. 8, Sep. 1997.

Hess et al., "Defect Cluster Analysis to Detect Equipment Specific Yield Loss Based on Yield–to–Area Calculations," Proc. SPIE's 1997 Microelectronic Manufacturing Conference, vol. 3216, Oct. 1997.

Hess et al., "Strategy to Disentangle Multiple Faults to Identify Random Defects within Test Structures," Proc. IEEE 1998 Int. Conference on Microelectronic Test Structures, vol. 11, Mar. 1998.

Hess et al., "Wafer Level Defect Density Distribution Using Checkerboard Test Structures," Proc. IEEE 1998 Int. Conference on Microelectronic Test Structures, vol. 11, Mar. 1998.

Hess et al., "Novel Methodology to Include all Measured Extension Values per Defect to Improve Defect Size Distributions," Proc. IEEE/SEMI 1998 Advanced Semiconductor Manufacturing Conference, vol. 9, Sep. 1998.

* cited by examiner

TEST STRUCTURE AND METHODOLOGY FOR CHARACTERIZING ETCHING IN AN INTEGRATED CIRCUIT FABRICATION PROCESS

BACKGROUND OF THE INVENTION

1. Field of the Invention

This invention relates to integrated circuit fabrication and, more particularly, to a test structure for characterizing integrated circuit etch processes.

2. Description of the Related Art

Fabricating integrated circuits involves placing numerous devices in a single semiconductor substrate and connecting isolated devices though specific electrical paths. Structures that electrically separate or "isolate" one device from another are thus required. Select devices may then be interconnected by conductors extending over a dielectric that isolates those devices. From this perspective, isolation and interconnect routing technologies are two of many critical aspects involved in fabricating a functional integrated circuit.

A popular isolation technology used in integrated circuits involves the technique known as "shallow trench isolation." The shallow trench isolation process is better suited for isolating densely spaced active devices having field regions less than, e.g., 3.0–5.0 μm in the lateral dimension than is the previously developed local oxidation of silicon ("LOCOS") technique. The trench isolation process involves etching a silicon substrate surface to a relatively shallow depth (e.g., between about 0.2 and 0.5 μm) and then filling the shallow trench with a deposited dielectric (referred to henceforth as "trench dielectric"). Some trench isolation processes include an interim step of growing silicon dioxide on trench walls prior to the trench being filled. After the trench is filled, it is then planarized to complete the isolation structure.

In order to connect isolated devices, many integrated circuits purposefully circumvent the isolation structures by routing an interconnect line between devices over the isolation dielectric. This is known as "local interconnect." The interconnect generally connects the source (or drain) region on one device to the source (or drain) region, or to the gate conductor, on another device. Many types of materials may be used to establish local interconnects. For example, local interconnects can be formed from (i) a single or double-doped polycrystalline silicon ("polysilicon"), (ii) a refractory metal silicide upon polysilicon, (iii) multi-layered refractory metal partially converted to silicide, or (iv) refractory metal deposited by physical vapor deposition ("PVD") or chemical vapor deposition ("CVD").

Local interconnects, when covered with a dielectric, allow global interconnects such as metal conductors to extend over the local interconnect and buried contacts. Thus, local interconnects afford an additional interconnect level, provided the added resistance of a local interconnect would not deleteriously affect circuit performance. For this reason, local interconnects are generally used for short interconnect runs relative to much longer metal conductors. Local interconnects are used primarily to interconnect gates and sources and drains in MOS circuits, and are prevalent in, for example, high-density VLSI logic and SRAMs. An SRAM cell layout can be substantially reduced when a local interconnect level and associated buried contacts are used.

FIGS. 1A and 1B depict a partial top plan view and a partial cross-sectional view along line B of FIG. 1A, respectively, of an exemplary integrated circuit topography 10 employing a local interconnect 42. A pair of MOSFET transistors 4 and 6 are arranged a lateral spaced distance apart upon and within a semiconductor substrate. Transistors 4 and 6 include respective conductive gate structures 20 and 30 interposed between respective source/drain regions 16 and 18. The source/drain regions 16 and 18 are arranged within the substrate and are isolated from each other by field isolation regions 14. Local interconnect 42 extends across the substrate and isolation regions from conductive gate structure 20 of transistor 4 to one source/drain region 18 of transistor 6. The local interconnect 42 is oriented such that it does not pass over source/drain regions 16 and cause unwanted shorting between conductive gate structure 20 and source/drain regions 16. Using a local interconnect to couple a gate of one transistor to a source/drain region of another transistor is prevalent in, for example, high density VLSI logic and SRAMs.

Conductive gate structures 20/30 include gate conductors 24/34 residing a spaced distance above substrate 12. As shown in FIG. 1B, gate conductor 34 is spaced above substrate 12 by gate dielectric 32. Spacers 26/36 are formed adjacent opposed sidewalls of gate conductors 24/34 and above lightly doped drain areas such as areas 18a. Metal silicides 28/38 are formed upon upper surfaces of the gate conductors and the source/drain areas (e.g., areas 18b). The gate conductors typically include polycrystalline silicon that is rendered conductive by implanting dopants therein. The gate conductors are formed by depositing polysilicon upon a substrate, followed by etching away select portions of the polysilicon to define the gate conductors.

In contrast, local interconnects can be formed using the so-called damascene process. That is, an interlevel dielectric (such as interlevel dielectric 40) is deposited across the substrate and gate areas, and then trenches are etched through the interlevel dielectric to the underlying gate areas and/or silicided source/drain areas. A conductive material, e.g., tungsten, is deposited into the trenches to a level spaced above the upper surface of the interlevel dielectric. The surface of the conductive material may be removed to a level commensurate with the upper surface of the interlevel dielectric using, e.g., chemical-mechanical polishing. Ohmic contacts (not shown) may also be formed by etching through an interlevel dielectric above the surfaces of interlevel dielectric 40 and local interconnect 42. Openings (i.e., vias) are etched through the interlevel dielectric to underlying structures and then filled with a conductive material. Generally, contacts are used to couple global interconnect to local interconnect, gate conductors, junctions, and other levels of global interconnect.

The trenches in which metal local interconnects are formed may be several thousands of angstroms deep. As such, the time required for etching the trenches may be substantial, particularly if a significant over-etch is included in the process to ensure complete etching of the trenches uniformly across the wafer. The potential thus exists for damage to the underlying substrate and/or isolation regions. In particular, the metal silicide that may be formed upon the active areas to improve electrical connections to the source and drain is typically more resistant to the etchants used to form the trenches than is the silicon dioxide of the isolation regions. As such, because a material discontinuity exists at the interface between the active areas and the isolation regions, such interfaces are particularly subject to attack during the etching processes. If significant etching occurs at such interfaces, local interconnect metal may be introduced into the resulting fissures. Consequently, electrical connection may be made between the heavily doped source/drain regions and the oppositely doped bulk substrate, as well as between the substrate at one transistor and the gate of the other transistor to which the interconnect is coupled, causing the integrated circuit to become grounded or shorted to substrate 12.

FIG. 2A depicts an expanded view of region 2 of FIG. 1B according to an embodiment in which etching at the active region/isolation region interface is minimal. As such, no conductive pathway is formed between the substrate and the transistors formed upon and within the substrate. As shown in FIG. 2A, local interconnect 42 includes a tungsten layer 42b formed upon a titanium underlayer 42a. Titanium layer 42a is formed between tungsten layer 42b and the underlying topography to facilitate adhesion of the tungsten to the silicon dioxide field region and the active region. Alternatively, local interconnect 42 may include a metal exhibiting good adhesion to the underlying topography without the need for an intervening underlayer. As shown in FIG. 2A, the titanium layer is in contact with metal silicide 38 that has been formed upon source/drain regions 18b. Alternatively, the local interconnect may be formed directly upon the source/drain regions in the active areas.

FIG. 2B depicts an expanded view of region 2 of FIG. 1B according to an alternative embodiment in which etching at the active region/isolation region interface is substantial. As such, titanium "spike" 44 is formed in the resultant fissure during deposition of titanium underlayer 42a, such that electrical connection is made between bulk substrate 12 and source/drain region 18b. Unfortunately, however, detection of such destructive over-etching and the resulting electrical connections requires extensive and time-consuming electrical testing that is conducted only after integrated circuit fabrication is completed. The resulting time delay between formation and detection may mean that large numbers of defective integrated circuits are produced before the problem is identified and corrected. Likewise, if visual analysis for defects is performed using, e.g., scanning electron microscopy, the time required to examine sufficient area to detect defects occurring with a low frequency (e.g., on the order of 0.1/cm$^2$) becomes prohibitive.

It would therefore be beneficial to develop a method for characterizing the etching procedures used in integrated circuit fabrication to test for gap formation between the isolation regions and junction regions of the semiconductor substrate. In particular, it would be advantageous to have the capacity to characterize methods used for etching silicon dioxide layers, such as layers from which interlevel dielectrics are formed. Accurate information on possible overetching at the active region/isolation region interface would be useful in minimizing or eliminating grounding, shorting, or other etch-related defects in integrated circuits fabricated using the processes being tested.

SUMMARY OF THE INVENTION

The problems outlined above may be solved by the technique herein for forming and using a test structure for characterizing etching processes used in an integrated circuit fabrication methodology. According to an embodiment, a test structure is formed upon a substrate. The test structure preferably includes a contrast layer, a simulated substrate, and a pattern layer formed in order upon the substrate. The substrate may be a silicon wafer. The silicon wafer may be a wafer not previously used for any other application. Alternatively, the silicon wafer may be a wafer that was previously used and that has been reconditioned for use with the test structure. For example, the wafer may be a wafer that was used to characterize silicon nitride deposition in a deposition furnace. According to this embodiment, the silicon nitride is stripped from the wafer and the wafer surface cleaned prior to formation of the contrast layer.

The contrast layer is preferably a layer having etch characteristics differing from etch characteristics of the substrate, the simulated substrate, and the pattern layer. In an embodiment, the contrast layer may be a layer of silicon nitride. Preferably, the silicon nitride has a thickness substantially between about 1000 angstroms and about 1400 angstroms. According to this embodiment, a layer of silicon dioxide may be formed upon the upper surface of the wafer prior to formation of the silicon nitride. The silicon dioxide layer may have a thickness substantially between about 300 angstroms and about 500 angstroms. Alternatively, the silicon dioxide layer may be omitted.

The simulated substrate preferably mimics an actual substrate in a production integrated circuit. The simulated substrate may include polycrystalline silicon portions that simulate the silicon active areas of an integrated circuit topography, along with dielectric areas that simulate the field or isolation regions of the integrated circuit topography. Preferably, the simulated substrate has a thickness substantially between about 1800 angstroms and about 2200 angstroms.

The pattern layer preferably includes a dielectric material. Preferably, the pattern layer includes undoped silicon dioxide. Alternatively, the pattern layer may include silicon dioxide doped with phosphorous and/or boron; an organic material having a low dielectric constant; or any other material suitable for forming an interlevel dielectric for electrically isolating conductive structures in an integrated circuit. An upper surface of the pattern layer may be planarized using, e.g., chemical-mechanical polishing, to complete the test structure. Preferably, the pattern layer is planarized to a final thickness substantially between about 6000 angstroms and about 8000 angstroms.

The test structure may be selectively etched using an etch methodology designed to form local interconnect trenches in a production integrated circuit methodology. According to the etch methodology, a layer of photoresist may be deposited across the pattern layer and selectively patterned, as is well known in the art. The patterned photoresist may then be etched using, e.g., an etch methodology such as plasma ("dry") etching or reactive ion etching to form trenches in the pattern layer. Preferably, the trenches are formed to a width of no greater than about 1 μm.

The trenches are preferably spaced across the wafer such that at least a portion of the trenches span the interface between the polysilicon portions and the dielectric portions of the simulated substrate. As such, the test structure may be used to evaluate the etch procedure for damage to the active regions and isolation regions caused by etching. The etch procedure may produce fissures in the dielectric portions of the simulated substrate at the interface with the polysilicon portions. Preferably, the polysilicon portions and the dielectric portions have thicknesses substantially equivalent to a depth of source and drain impurity areas in a production integrated circuit. As such, formation of a fissure completely through the simulated substrate represents formation of a fissure that may lead to shorting between the active area and the bulk substrate of a production integrated circuit when the fissure is filled with a conductive material.

The etched test structure may then be exposed to a wet etchant that will selectively etch the contrast layer without etching the substrate, the simulated substrate, or the pattern layer. In an embodiment in which the substrate, the simulated substrate, and the pattern layer include single crystalline silicon; polysilicon and silicon dioxide; and silicon dioxide, respectively, and in which the contrast layer includes silicon nitride, the wet etchant may be phosphoric acid. The wet etchant preferably penetrates into the fissures during exposure. Because the wet etchant is selected to preferentially etch the contrast layer, the fissures are not expected to be deepened during the wet etch. The contrast layer therefore should remain intact beneath fissures that do not span a thickness of the dielectric layer.

The wet etchant would be expected to penetrate to the underlying contrast layer through fissures that extend through the simulated substrate, however. As such, a portion of the contrast layer adjacent the bottom of such fissures will be removed upon exposure to the etchant, leaving a void. The dimensions of the void may depend upon factors such as the duration of exposure to the wet etchant, the size of the trench and/or the fissure (i.e., the rate of exposure to the wet etchant), the thickness of the contrast layer, and the rate at which the wet etchant etches the contrast layer.

When illuminated, areas of silicon nitride that have been exposed to a phosphoric acid etch appear white, whereas unetched silicon nitride appears yellow. Because the overlying silicon dioxide and polysilicon are optically transparent, etched areas of the underlying silicon nitride may be distinguished from unetched areas. Various detecting methods may be used to identify sites within a silicon nitride layer that have undergone phosphoric acid etching due to the presence of fissures within the simulated substrate. For example, test structures may undergo visual inspection in which an operator manually views the test structures by light microscopy to identify areas in which color changes are present.

According to the present method of optical inspection, the test structures are scanned using an image-to-image comparator. The image-to-image comparator compares pixels at identical locations in images of adjacent die sites on a wafer. Each pixel is assigned a gray-scale value, and three points are compared before a location is flagged as defective. That is, identical sites on a first die and a second die are compared for gray-scale values. The same sites on the second die and a third die are then compared. If any of the pixel values for the first, second, and third die sites differ, then an event is logged. The three-point evaluation then continues for the entire scanned distance across the wafer, in both forward and reverse directions. In this way, sites at which etching of the contrast layer has occurred can be identified based on their gray-scale values, and problems with over-etching can be identified. This automated inspection method covers much more wafer area than the manual inspection method, therefore improving the possible capture of fissure defects.

BRIEF DESCRIPTION OF THE DRAWINGS

Other objects and advantages of the invention will become apparent upon reading the following detailed description and upon reference to the accompanying drawings in which.

Figure 1A:
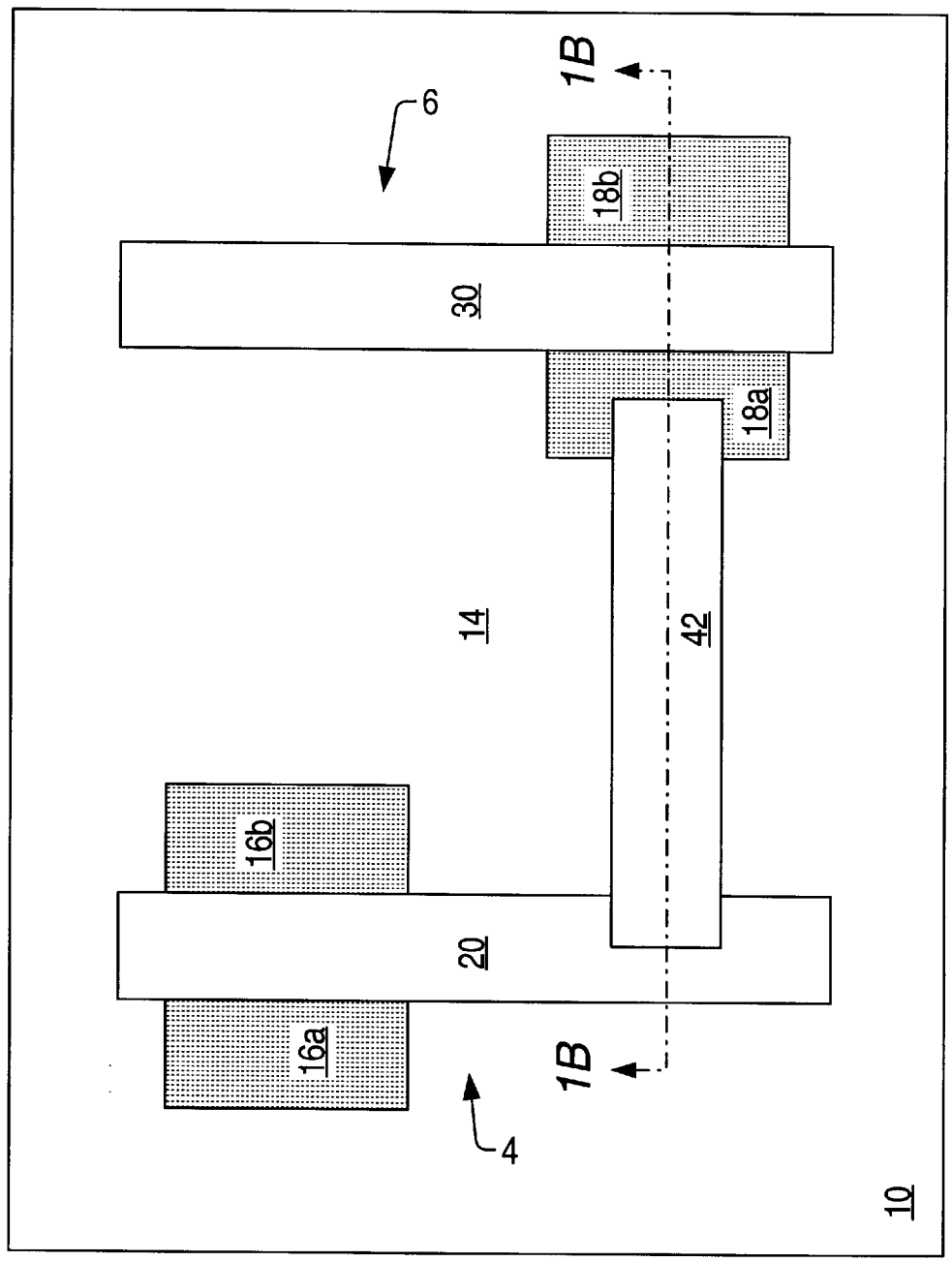
FIG. 1A depicts a top view of a portion of an integrated circuit topography including a local interconnect.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 7:
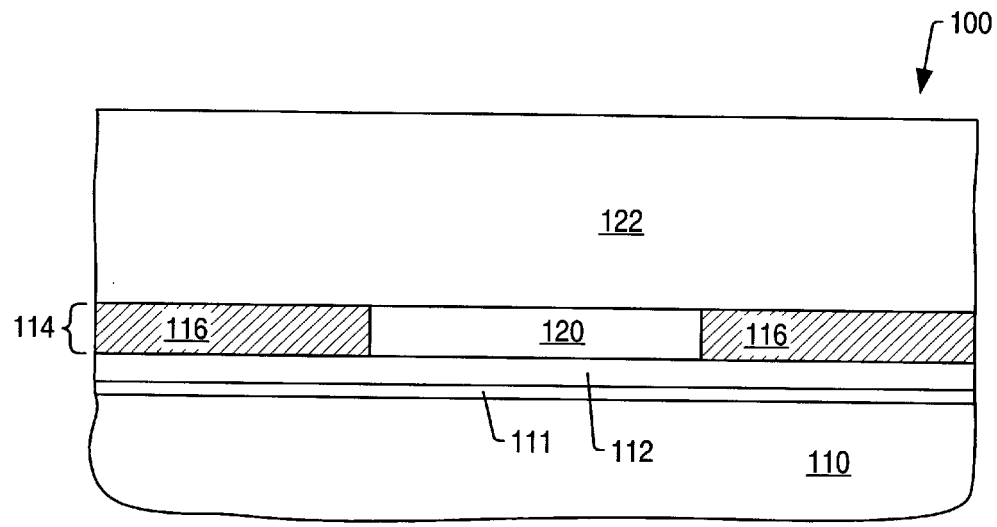
FIG. 7 depicts a cross-sectional view of the test structure after formation of a pattern layer upon the simulated substrate.

Turning now to the drawings, FIG. 7 depicts a cross-sectional view of a test structure for characterizing etch procedures according to an embodiment of the presently described methodology. Test structure 100 includes a substrate 110 upon which a contrast layer 112 resides. A simulated substrate 114 resides upon contrast layer 112, and a pattern layer 122 resides upon simulated substrate 114. The use of a simulated substrate above a contrast layer is necessary because defects introduced into a production integrated circuit topography during etching are difficult to detect, as previously described. As used in this application, "production integrated circuit topography" ("production topography") describes a topography that is contained within a packaged integrated circuit intended for use by a consumer of a product including the integrated circuit as an integral component. "Production integrated circuit fabrication methodology" ("production methodology") describes a process for fabricating a production topography. A test structure that simulates a production integrated circuit topography is therefore necessary in order to characterize the fabrication process, as will be explained in more detail below.

Figure 1B:
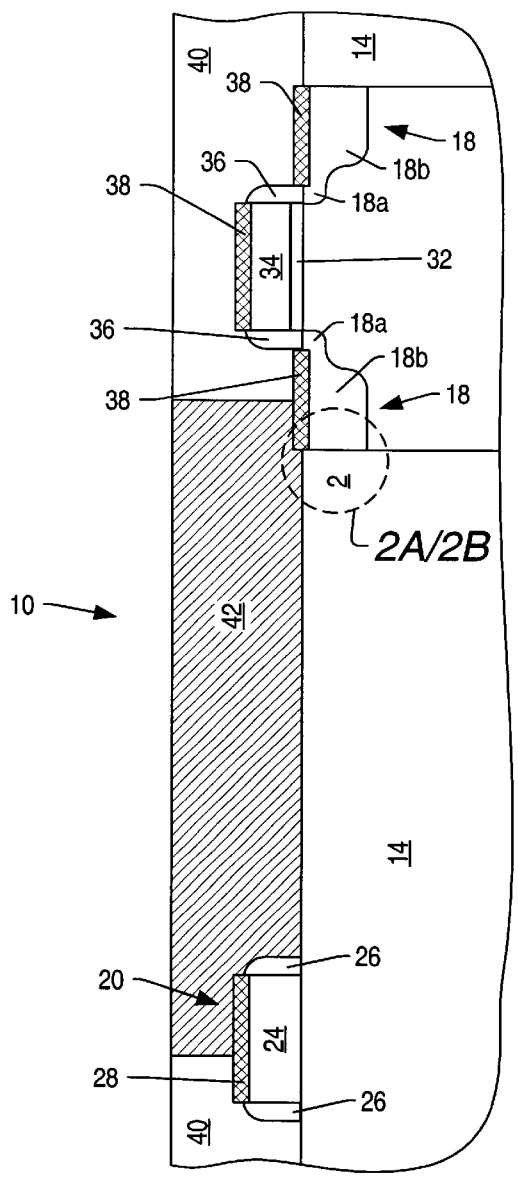
FIG. 1B depicts a cross-sectional view of the integrated circuit topography depicted in FIG. 1A.
Figure 2A:
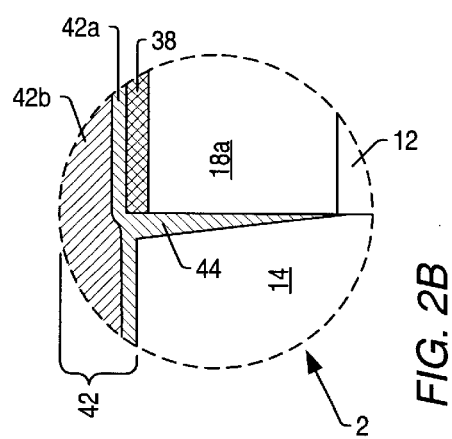
FIG. 2A depicts an expanded view of a portion of the integrated circuit topography depicted in FIG. 1B according to an embodiment.
Figure 2B:
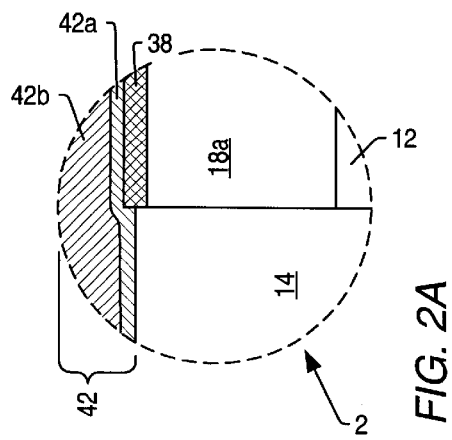
FIG. 2B depicts an expanded view of the portion of the integrated circuit topography depicted in FIG. 2A according to an alternative embodiment.

According to an embodiment, pattern layer 122 may include silicon dioxide ("oxide"). Simulated substrate 114 may include silicon dioxide portions 120 formed laterally adjacent polycrystalline silicon ("polysilicon") portions 116. Polysilicon portions 116 preferably simulate a semiconductor substrate (similar to substrate 12 depicted in FIG. 1B) upon which a production integrated circuit may be formed. Likewise, silicon dioxide portions 120 preferably simulate isolation regions (similar to isolation region 14 depicted in FIG. 1B) of the production integrated circuit. Contrast layer 112 preferably includes a material that may be etched selectively relative to substrate 110, simulated substrate 114, and pattern layer 122. According to an embodiment, contrast layer 112 includes silicon nitride ("nitride") formed upon a silicon dioxide pad layer 111. Substrate 110 may be a single crystal silicon wafer. According to an embodiment, substrate 110 may be a silicon wafer previously used for characterizing a silicon nitride deposition process and equipment. The deposited nitride and underlying oxide may be removed from the wafer upper surface and the upper surface cleaned in preparation for formation of the test structure described herein.

Figure 3:
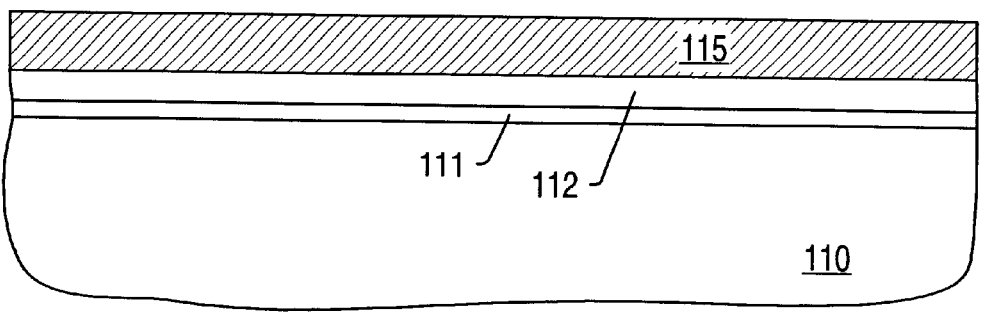
FIG. 3 depicts a cross-sectional view of a test structure substrate on which a contrast layer and a polycrystalline silicon layer have been formed.

Turning now to FIG. 3, contrast layer 112 is shown formed upon substrate 110. Contrast layer 112 may be deposited using, e.g., chemical-vapor deposition. In an embodiment in which contrast layer 112 includes silicon nitride, contrast layer 112 may be deposited by reacting ammonia with silane or dichlorosilane. If contrast layer 112 includes silicon nitride, a layer of silicon dioxide 111 may be grown upon the upper surface of substrate 110 to function as a pad oxide prior to deposition of the nitride layer. According to an embodiment, the silicon dioxide layer may have a thickness of substantially between about 300 angstroms and about 500 angstroms, and the silicon nitride may have a thickness substantially between about 1000 angstroms and about 1400 angstroms.

Figure 4:
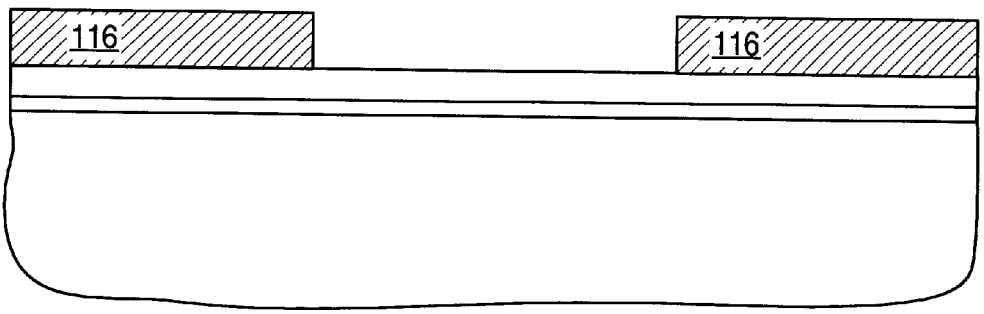
FIG. 4 depicts a cross-sectional view of the test structure after patterning of the polycrystalline silicon.
Figure 5:
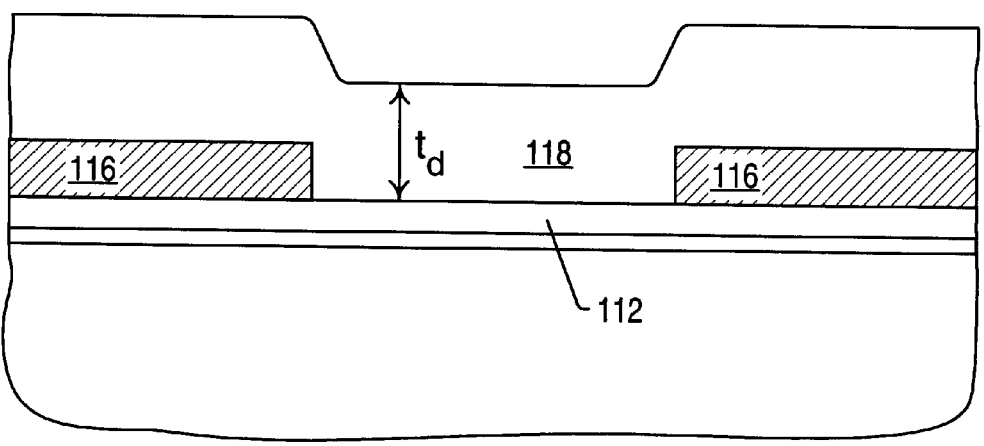
FIG. 5 depicts a cross-sectional view of the test structure after forming a dielectric layer upon the substrate and the polycrystalline silicon.

Polysilicon layer 115 may then be deposited upon contrast layer 112, by, e.g., chemical-vapor deposition from a silane-containing source. According to an embodiment, polysilicon layer 115 is deposited to a thickness between about 1800 angstroms and about 2200 angstroms. As shown in FIG. 4, the polysilicon layer may be patterned using well-known photolithographic processes to form polysilicon portions 116. A dielectric layer 118 may then be deposited upon polysilicon portions 116 and contrast layer 112, as shown in FIG. 5. Dielectric layer 118 may include silicon dioxide deposited by, e.g., reaction of dichlorosilane and nitrous oxide or by decomposition of tetraethyl orthosilicate. Preferably, dielectric layer 118 is deposited to a thickness greater than a thickness of polysilicon portions 116, and more preferably to a thickness two to three times the thickness of polysilicon portions 116, such that a thickness $t_d$ of the dielectric layer above the contrast layer is greater than the thickness of the polysilicon portions.

Figure 6:
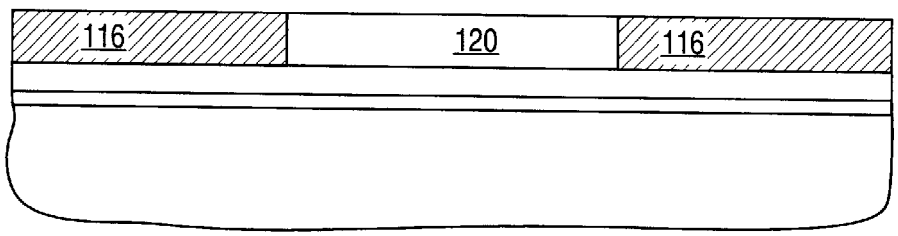
FIG. 6 depicts a cross-sectional view of the test structure after polishing the dielectric layer to form a simulated substrate.

Turning now to FIGS. 6 and 7, simulated substrate 114 is completed by removing upper portions of dielectric layer 118 to form dielectric portions 120 laterally adjacent polysilicon portions 116. Upper portions of dielectric layer 118 may be removed using, e.g., chemical-mechanical polish such that upper surfaces of polysilicon portions 116 and dielectric portions 120 are coplanar. In an embodiment, polysilicon layer 115 may be photolithographically patterned using a reticle having a comb-and-serpentine pattern such that polysilicon portions 116 include at least one meandering line, and preferably a series of meandering polysilicon lines. As such, dielectric portions 120 will also include at least one meandering line, and preferably a series of meandering lines.

Pattern layer 122 is then formed upon an upper surface of simulated substrate 114, as shown in FIG. 7. Pattern layer 122 preferably is formed of a dielectric material. Preferably, pattern layer 122 is formed of undoped silicon dioxide. Alternatively, pattern layer 122 may be formed of silicon dioxide doped with phosphorous and/or boron; an organic material having a low dielectric constant; or any other material suitable for forming an interlevel dielectric for electrically isolating conductive structures in an integrated circuit. An upper surface of pattern layer 122 may be planarized using, e.g., chemical-mechanical polishing, to complete test structure 100. Preferably, pattern layer 122 is planarized to a final thickness substantially between about 6000 angstroms and about 8000 angstroms.

Figure 8:
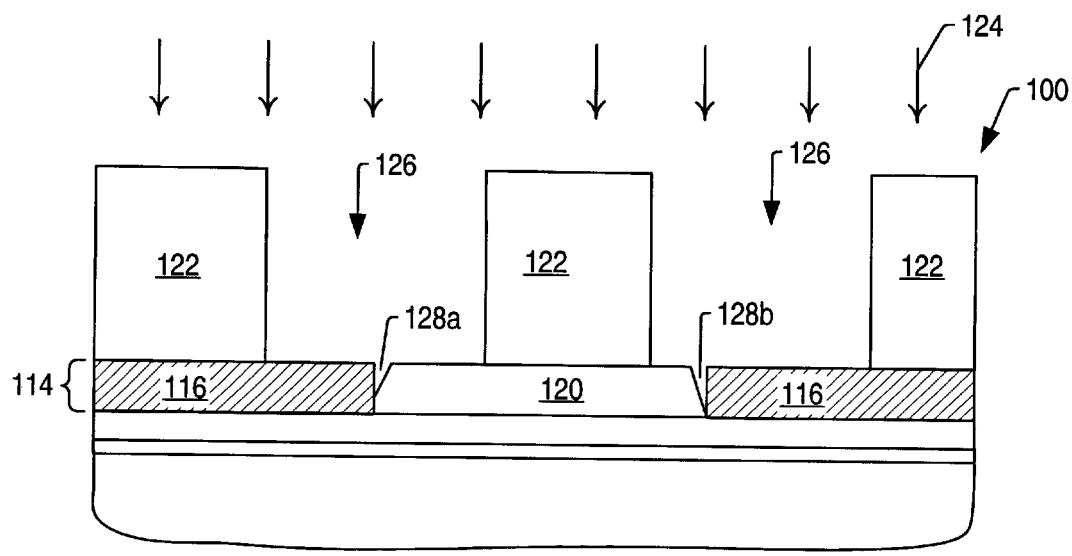
FIG. 8 depicts a cross-sectional view of the test structure after etching the pattern layer.

Test structure 100 may be selectively etched using an etch methodology designed to form local interconnect trenches in a production integrated circuit methodology, as shown in FIG. 8. According to the etch methodology, a layer of photoresist (not shown) may be deposited across pattern layer 122 and selectively patterned, as is well known in the art. The patterned photoresist may then be etched using, e.g., an etch methodology 124 such as plasma ("dry") etching or reactive ion etching to form trenches 126 in the pattern layer. Preferably, trenches 126 are formed to a width of no greater than than about 1 $\mu$m.

Trenches 126 are preferably spaced across the wafer such that at least a portion of the trenches span the interface between the polysilicon portions and the dielectric portions of simulated substrate 114, as depicted in FIG. 8. As such, test structure 100 may be used to evaluate the etch procedure for damage to the active regions and isolation regions caused by etching. As shown in FIG. 8, the etch procedure has produced fissures 128a and 128b in dielectric portion 120 of simulated substrate 114 adjacent polysilicon portions 116. It is to be noted that the widths of fissures 128a and 128b are exaggerated for illustration purposes. Preferably, polysilicon portions 116 and dielectric portion 120 have a thickness substantially equivalent to a depth of source and drain impurity areas in a production integrated circuit (e.g., areas 18a/18b in FIG. 1B). As such, formation of a fissure completely through the simulated substrate represents formation of a fissure that may lead to shorting between the active area and the bulk substrate of a production integrated circuit when the fissure is filled with a conductive material.

Figure 9:
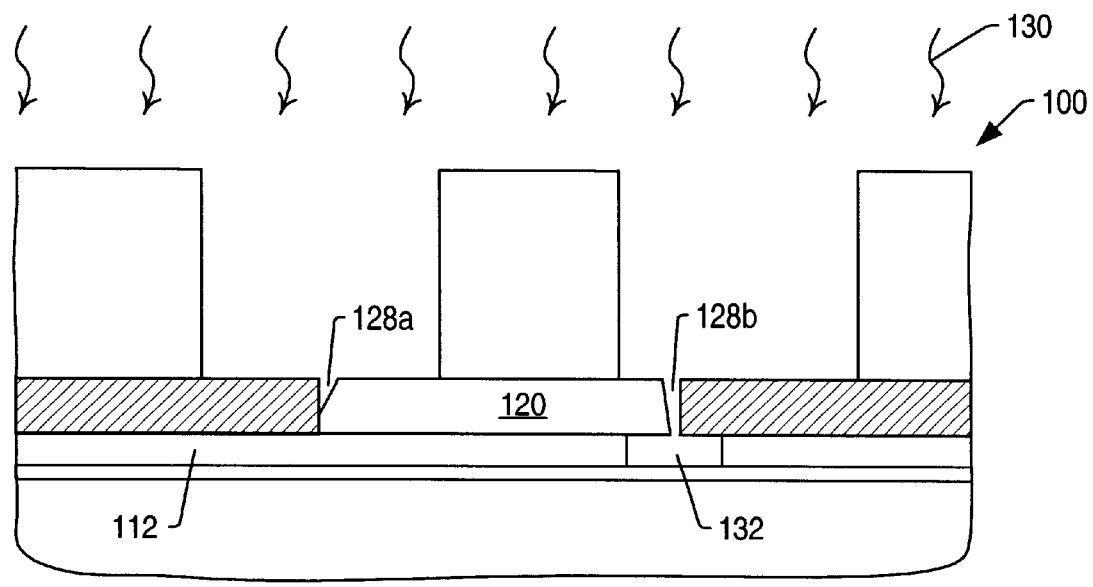
FIG. 9 depicts a cross-sectional view of the test structure after exposing the contrast layer to a wet etchant.

As shown in FIG. 9, the etched test structure has been exposed to a wet etchant 130 that will selectively etch the contrast layer without etching the substrate, the simulated substrate, or the pattern layer. In an embodiment in which the substrate, the simulated substrate, and the pattern layer include single crystalline silicon; polysilicon and silicon dioxide; and silicon dioxide, respectively, and in which the contrast layer includes silicon nitride, the wet etchant may be phosphoric acid. Wet etchant 130 preferably penetrates into fissures 128 during exposure. Because wet etchant 130 is selected to preferentially etch the contrast layer, fissures 128 should not be deepened during the wet etch. Contrast layer 112 therefore should remain intact beneath fissures such as fissure 128a, which does not completely span a thickness of dielectric layer 120.

Because fissure 128b, however, does extend entirely through the thickness of dielectric layer 120, wet etchant 130 is able to penetrate to the underlying contrast layer. As such, a portion of the contrast layer adjacent the bottom of fissure 128b is removed upon exposure to the etchant, leaving a void 132. The dimensions of the void may depend upon factors such as the duration of exposure to the wet etchant, the size of the trench and/or the fissure (i.e., the rate of exposure to the wet etchant), the thickness of the contrast layer, and the rate at which the wet etchant etches the contrast layer.

Figure 10:
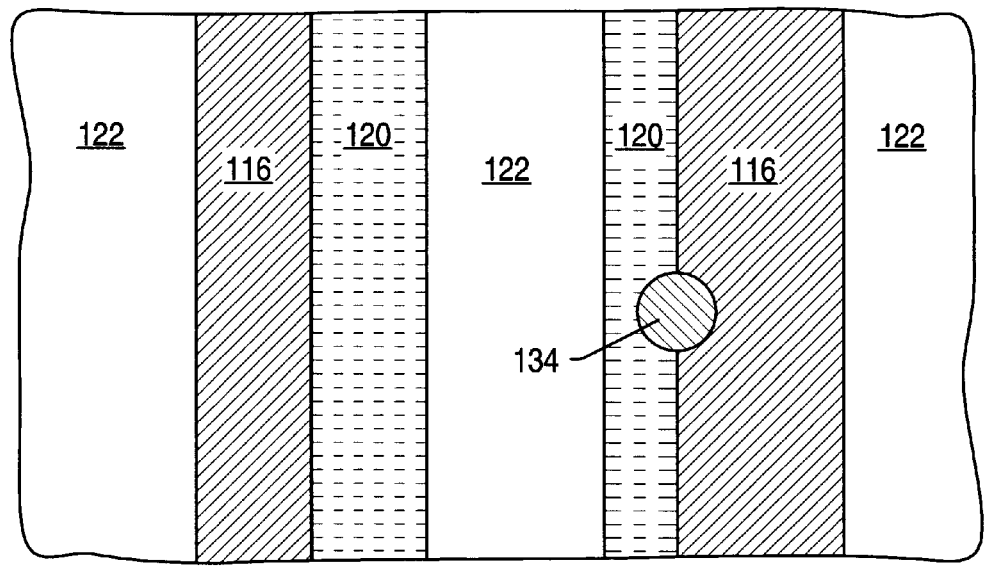
FIG. 10 depicts a top view of the test structure of FIG. 9 showing a pattern of etching of the contrast layer.

FIG. 10 depicts a top view of the etched test structure of FIG. 9. When illuminated, areas of silicon nitride that have been exposed to a phosphoric acid etch appear white, whereas unetched silicon nitride appears yellow. Because the overlying silicon dioxide and polysilicon are optically transparent, etched areas of the underlying silicon nitride may be distinguished from unetched areas. Various detecting methods may be used to identify sites within a silicon nitride layer that have undergone phosphoric acid etching due to the presence of fissures within the simulated substrate. For example, test structures may undergo visual inspection in which an operator manually views the test structures by light microscopy to identify areas in which color changes are present.

According to the present method of optical inspection, the test structures are scanned using an image-to-image comparator (such as one of the KLA-2100 series available from KLA-Tencor, San Jose, Calif.). The image-to-image comparator includes a sophisticated image-processing computer that compares pixels at identical locations in images of adjacent die sites on a wafer. Each pixel is assigned a gray-scale value, and three points are compared before a location is flagged as defective. That is, identical sites on a first die and a second die are compared for gray-scale values. The same sites on the second die and a third die are then compared. If any of the pixel values for the first, second, and third die sites differ, then an event is logged. The three-point evaluation then continues for the entire scanned distance across the wafer, in both forward and reverse directions. In this way, defect sites (i.e., sites at which etching of the contrast layer has occurred) can be identified based on their gray-scale values, and problems with over-etching can be identified.

According to alternative embodiments of the testing method described herein, the test structure may be used to characterize processes other than etching of an interlevel dielectric for local interconnect formation. As a first example, the test structure may be used to detect particulate matter that is deposited in the isolation structure or the polysilicon. If a particle is dislodged during polishing of the simulated substrate, the resulting hole may extend to the contrast layer and result in formation of a void in the contrast layer during the subsequent wet etching. Such voids will be detected in the middle of the dielectric or the polysilicon rather than appearing at the interface between them. In addition, even if the particle is not removed, it may be detected during optical analysis due to the contrast difference with the surrounding material. Further, pinholes created in the polysilicon or dielectric during deposition could also be detected by optical analysis after the wet etch.

As another example, polishing of the simulated substrate may introduce scratches into the upper surfaces of the dielectric and/or the polysilicon. The pattern layer formed upon the upper surfaces may act as a lens to enhance the scratches during optical analysis, such that the scratches are readily identified. As an additional example, it is theorized that polishing polysilicon may lead to improved lithography capabilities during patterning. The test structure described herein may be used to examine the effects of chemical mechanical polishing on polysilicon etching by comparing polished with unpolished structures.

As a further example, the test structure described herein may be used to identify problems resulting from design changes. Modifications to the layout of integrated circuits may lead to changes in geometry, which in turn may give rise to changes in localized etch effects. Currently, failure analysis must be performed on finished integrated circuits to detect such changes. The test structure and method described herein would provide more rapid information on potential problems due to changes in etching effects without sacrificing production integrated circuits.

It will be appreciated to those skilled in the art having the benefit of this disclosure that this invention is believed to provide a test structure for characterizing a local interconnect fabrication methodology and a method for fabricating the test structure. It will be further appreciated to those skilled in the art having the benefit of this disclosure that this invention is believed to provide a method for using the test structure to characterize the local interconnect fabrication methodology. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

What is claimed is:

1. A test structure for characterizing local interconnect formation, comprising:

a contrast layer residing above a substrate;

a simulated substrate including a first material residing laterally adjacent a second material, both of which reside upon the contrast layer; and a pattern layer residing upon said simulated substrate, wherein the pattern layer includes openings extending therethrough to the lateral boundary between the first and second materials.

2. The test structure as recited in claim 1, wherein said contrast layer comprises a material having etch properties different from etch properties of said substrate, said simulated substrate, and said pattern layer.

3. The test structure as recited in claim 1, wherein said contrast layer comprises silicon nitride.

4. The test structure as recited in claim 1, wherein a thickness of said contrast layer is substantially between about 1000 angstroms and about 1400 angstroms.

5. The test structure as recited in claim 3, wherein said substrate comprises single crystalline silicon having a layer of silicon dioxide upon an upper surface thereof.

6. The test structure as recited in claim 5, wherein a thickness of said layer of silicon dioxide is substantially between about 300 angstroms and about 500 angstroms.

7. The test structure as recited in claim 1, wherein said first material comprises polycrystalline silicon, and wherein said second material comprises silicon dioxide.

8. The test structure as recited in claim 1, wherein a thickness of said simulated substrate is substantially between about 1800 angstroms and about 2200 angstroms.

9. The test structure as recited in claim 1, wherein said pattern layer comprises silicon dioxide.

10. The test structure as recited in claim 1, wherein a thickness of said pattern layer is substantially between about 6000 angstroms and about 8000 angstroms.

11. The test structure of claim 1, wherein a width of one or more of said openings is less than approximately 1 $\mu$m.

12. The test structure of claim 1, wherein said openings are spaced across the test structure, and wherein at least a portion of the openings span the interface between the first material and the second material.

13. The test structure of claim 1, wherein said first material comprises one or more meandering lines.

14. The test structure of claim 1, wherein said second material comprises one or more meandering lines.

* * * * *